(12) United States Patent
El-Wardany et al.

(10) Patent No.: US 11,000,899 B2
(45) Date of Patent: May 11, 2021

(54) HOLLOW AIRFOIL CONSTRUCTION UTILIZING FUNCTIONALLY GRADED MATERIALS

(75) Inventors: Tahany Ibrahim El-Wardany, Bloomfield, CT (US); Wenjiong Gu, Glastonbury, CT (US); Daniel A. Mosher, Glastonbury, CT (US); Daniel V. Viens, Mansfield Center, CT (US); Changsheng Guo, South Windsor, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 2841 days.

(21) Appl. No.: 13/360,753

(22) Filed: Jan. 29, 2012

(65) Prior Publication Data
US 2013/0195671 A1 Aug. 1, 2013

(51) Int. Cl.
*B22F 5/04* (2006.01)
*C22C 14/00* (2006.01)
(Continued)

(52) U.S. Cl.
CPC ............ *B22F 5/04* (2013.01); *B21D 53/78* (2013.01); *B22F 10/20* (2021.01); *B23P 15/04* (2013.01);
(Continued)

(58) Field of Classification Search
CPC .. B23K 26/34; B23K 26/3206; B23K 26/345; B23K 2201/001; B23K 2201/34; C23C 14/28; C23C 26/02; C23C 24/10; C23C 28/028; C23C 22/70; C23C 22/72; C23C 22/73; C23C 28/022; B22F 5/04; B22F 3/1055; B22F 3/1051; B22F 3/1052; B22F 3/1053; B22F 3/1054; B23P 15/04; B21D 53/78; Y10T 29/49336; Y10T 29/49339; F01D 5/286; F01D 5/147; F01D 5/28; F01D 9/00; F01D 5/14; F01D 25/005; F05D 2300/611; F05D 2220/36; F05D 2230/31;
(Continued)

(56) References Cited

U.S. PATENT DOCUMENTS 5,038,014 A 8/1991 Pratt et al.
5,826,332 A 10/1998 Bichon et al.
(Continued)

FOREIGN PATENT DOCUMENTS

DE 2742816 A1 3/1979
DE 3942051 A1 8/1990
(Continued)

OTHER PUBLICATIONS

European Search Report for European Patent Application No. 13151444.0 completed May 29, 2013.
(Continued)

*Primary Examiner* — Christopher Verdier
(74) *Attorney, Agent, or Firm* — Carlson, Gaskey & Olds, P.C.

(57) ABSTRACT

A method of forming an airfoil includes the steps of depositing material to form an airfoil in a first layer, and then depositing material in a second layer on the first layer. The first and second layers have distinct densities. An airfoil is also disclosed. The method provides powerful design advantages.

19 Claims, 5 Drawing Sheets

(51) Int. Cl.

| | | |
|---|---|---|
| *F01D 5/14* | (2006.01) | |
| *F01D 5/28* | (2006.01) | |
| *B22F 10/20* | (2021.01) | |
| *C23C 22/73* | (2006.01) | |
| *B23P 15/04* | (2006.01) | |
| *B33Y 50/02* | (2015.01) | |
| *C23C 28/02* | (2006.01) | |
| *F01D 25/00* | (2006.01) | |
| *C23C 26/02* | (2006.01) | |
| *B29C 64/153* | (2017.01) | |
| *C23C 22/70* | (2006.01) | |
| *C23C 14/28* | (2006.01) | |
| *C23C 22/72* | (2006.01) | |
| *B21D 53/78* | (2006.01) | |
| *C23C 24/10* | (2006.01) | |
| *B29C 64/386* | (2017.01) | |
| *B33Y 10/00* | (2015.01) | |
| *B33Y 80/00* | (2015.01) | |

(52) U.S. Cl.
CPC .......... *B29C 64/153* (2017.08); *B29C 64/386* (2017.08); *B33Y 50/02* (2014.12); *C22C 14/00* (2013.01); *C23C 14/28* (2013.01); *C23C 22/70* (2013.01); *C23C 22/72* (2013.01); *C23C 22/73* (2013.01); *C23C 24/10* (2013.01); *C23C 26/02* (2013.01); *C23C 28/028* (2013.01); *F01D 5/147* (2013.01); *F01D 5/28* (2013.01); *F01D 5/286* (2013.01); *F01D 25/005* (2013.01); *B33Y 10/00* (2014.12); *B33Y 80/00* (2014.12); *F05D 2220/36* (2013.01); *F05D 2230/22* (2013.01); *F05D 2230/31* (2013.01); *F05D 2300/611* (2013.01); *Y02P 10/25* (2015.11); *Y10T 29/49336* (2015.01); *Y10T 29/49339* (2015.01)

(58) Field of Classification Search
CPC . F05D 2300/6111; B33Y 10/00; B33Y 50/02; B33Y 80/00; B29C 64/386; B29C 64/153
USPC ................ 427/595–597, 553–556; 415/200; 416/229 R, 229 A, 241 R, 232, 233, 416/219 R, 220 R
See application file for complete search history.

(56) References Cited

U.S. PATENT DOCUMENTS

| | | |
|---|---|---|
| 5,839,882 A | 11/1998 | Finn et al. |
| 6,046,426 A | 4/2000 | Jeantette et al. |
| 6,269,540 B1 | 8/2001 | Islam et al. |
| 6,355,086 B2 | 3/2002 | Brown et al. |
| 6,391,251 B1 | 5/2002 | Keicher et al. |
| 7,967,570 B2 | 6/2011 | Shi et al. |
| 8,066,483 B1 | 11/2011 | Liang |
| 2003/0047298 A1* | 3/2003 | Tiemann ........................ 164/137 |
| 2003/0129061 A1 | 7/2003 | Finn et al. |
| 2006/0054079 A1 | 3/2006 | Withey et al. |
| 2006/0233951 A1 | 10/2006 | DeBiccari et al. |
| 2007/0003416 A1* | 1/2007 | Bewlay et al. ........... 416/241 R |
| 2007/0134096 A1 | 6/2007 | Mons et al. |
| 2007/0275210 A1 | 11/2007 | Heselhaus |
| 2008/0290215 A1 | 11/2008 | Udall et al. |
| 2009/0280269 A1 | 11/2009 | Bewlay et al. |
| 2010/0200189 A1 | 8/2010 | Qi et al. |
| 2010/0221118 A1* | 9/2010 | Prevey, III ................ 416/241 R |
| 2010/0242843 A1 | 9/2010 | Peretti et al. |
| 2011/0217178 A1* | 9/2011 | Mazzola et al. .......... 416/241 R |
| 2012/0093674 A1* | 4/2012 | Abe .................... B29C 67/0077 419/7 |
| 2013/0001837 A1 | 1/2013 | Gohler et al. |

FOREIGN PATENT DOCUMENTS

| | | | |
|---|---|---|---|
| DE | 10243415 A1 | 4/2004 | |
| DE | 102010036527 A1 | 2/2011 | |
| DE | 102009051479 A1 | 5/2011 | |
| EP | 1244605 B1 | 6/2003 | |
| EP | 1002618 B1 | 10/2008 | |
| EP | 1995411 A2 | 11/2008 | |
| EP | 2319641 A1 | 5/2011 | |
| EP | 2570595 A1 | 3/2013 | |
| WO | WO-2010/150805 A1 * | 12/2010 | ............ B23F 3/1055 |

OTHER PUBLICATIONS

Nalla, R.K. et al., On the influence of mechanical surface treatments—deep rolling and laser shock peening—on the fatigue behavior of Ti-6A1-4V at ambient and elevated temperatures, Materials Science and Engineering A355 (2003), Jan. 16, 2003, pp. 216-230.

Spierings, A.B. et al., Comparison of density of stainless steel 316L parts produced with selective laser melting using different powder grades, SFF Symposium 2009, Aug. 31, 2009, pp. 1-12.

Notice of Opposition of EP Patent No. 2620240, United Technologies Corporation opposed by Siemens Aktiengesellschaft, dated Jun. 17, 2016.

Notice of Opposition of EP Patent No. 2620240, United Technologies Corporation opposed by SNECMA, dated Jun. 17, 2016.

* cited by examiner

HOLLOW AIRFOIL CONSTRUCTION UTILIZING FUNCTIONALLY GRADED MATERIALS

BACKGROUND OF THE INVENTION

This application relates to a method for forming airfoil structures having hollow internal spaces, wherein the airfoil structure is formed in deposited layers.

Airfoils are utilized in any number of applications. In one well known application, a gas turbine engine includes blades associated with a fan section, a compressor section, and a turbine section, each of which have airfoils.

Gas turbine engines typically include the fan delivering air into the compressor. The air is compressed and delivered downstream into a combustion section. The air is mixed with fuel and burned, and products of the combustion pass over the turbine. Turbine rotors are driven to rotate, and in turn drive the compressor and fan rotors.

Typically in the past, a single turbine rotor drove both a low pressure compressor rotor and the fan. However, recently, geared connections have been included between the fan blade and the low pressure compressor rotor. With this advancement, a number of design freedoms have been achieved. One result is the fan blades may become larger in profile.

Larger fan blades may weigh more than the prior art. Thus, it has been proposed to make the fan blades to have internal cavities. One method of forming fan blades now utilizes complex metal which is attached as two layers, and then shaped into an airfoil configuration. Another method uses a main body with cavities, and having a covering sheet.

While these fan blades have desirable functional characteristics, they are also somewhat time consuming and expensive to manufacture.

As the fan blades increase in size, another concern is that their outer profile increases. Fan blades are exposed to ingestion of foreign objects, and result in damage. This potential increases as the size of the fan blade increase.

SUMMARY OF THE INVENTION

In a featured embodiment, a method of forming an airfoil includes the steps of depositing material to form an airfoil in a first layer, and then depositing material in a second layer on the first layer. The first and second layers have distinct densities.

In a further embodiment according to the previous embodiment, the first and second layers will be spaced radially when the airfoil is utilized as a rotating element.

In a further embodiment according to the previous embodiment, direct laser deposition is utilized to deposit the first and second layers.

In a further embodiment according to the previous embodiment, machining of internal cavities within the first layer occurs before the deposition of the second layer.

In a further embodiment according to the previous embodiment, a top layer is deposited which closes off internal cavities within the airfoil to define a radially outer end of the airfoil.

In a further embodiment according to the previous embodiment, internal machining is provided on the internal cavities within the airfoil prior to the deposition of the top layer.

In a further embodiment according to the previous embodiment, deep rolling peening processes are provided on the airfoil to induce compressive residual stress.

In a further embodiment according to the previous embodiment, external surfaces of the airfoil defining suction and pressure sizes are subject to surface finishing techniques after the deposition of the top layer.

In a further embodiment according to the previous embodiment, the airfoil is part of a fan blade for a gas turbine engine.

In a further embodiment according to the previous embodiment, the first layer is radially inward of the second layer, and the first layer has a greater density than the second layer.

In a further embodiment according to the previous embodiment, the first and second layers include side walls, with ribs crossing between the side walls.

In another featured embodiment, an airfoil extends between a radially inner end and a radially outer end. The airfoil is constructed by deposition of a plurality of layers. The layers are deposited in changing densities, such as the density of the airfoil varies from the radially inner end to the radially outer end.

In a further embodiment according to the previous embodiment, the first and second layers will be spaced radially when the airfoil is utilized as a rotating element.

In a further embodiment according to the previous embodiment, a top layer closes off internal cavities within the airfoil to define a radially outer end of the airfoil.

In a further embodiment according to the previous embodiment, the airfoil is part of a fan blade for a gas turbine engine.

These and other features of this application will be best understood from the following specification and drawings, the following of which is a brief description.

DETAILED DESCRIPTION

Figure 1A:
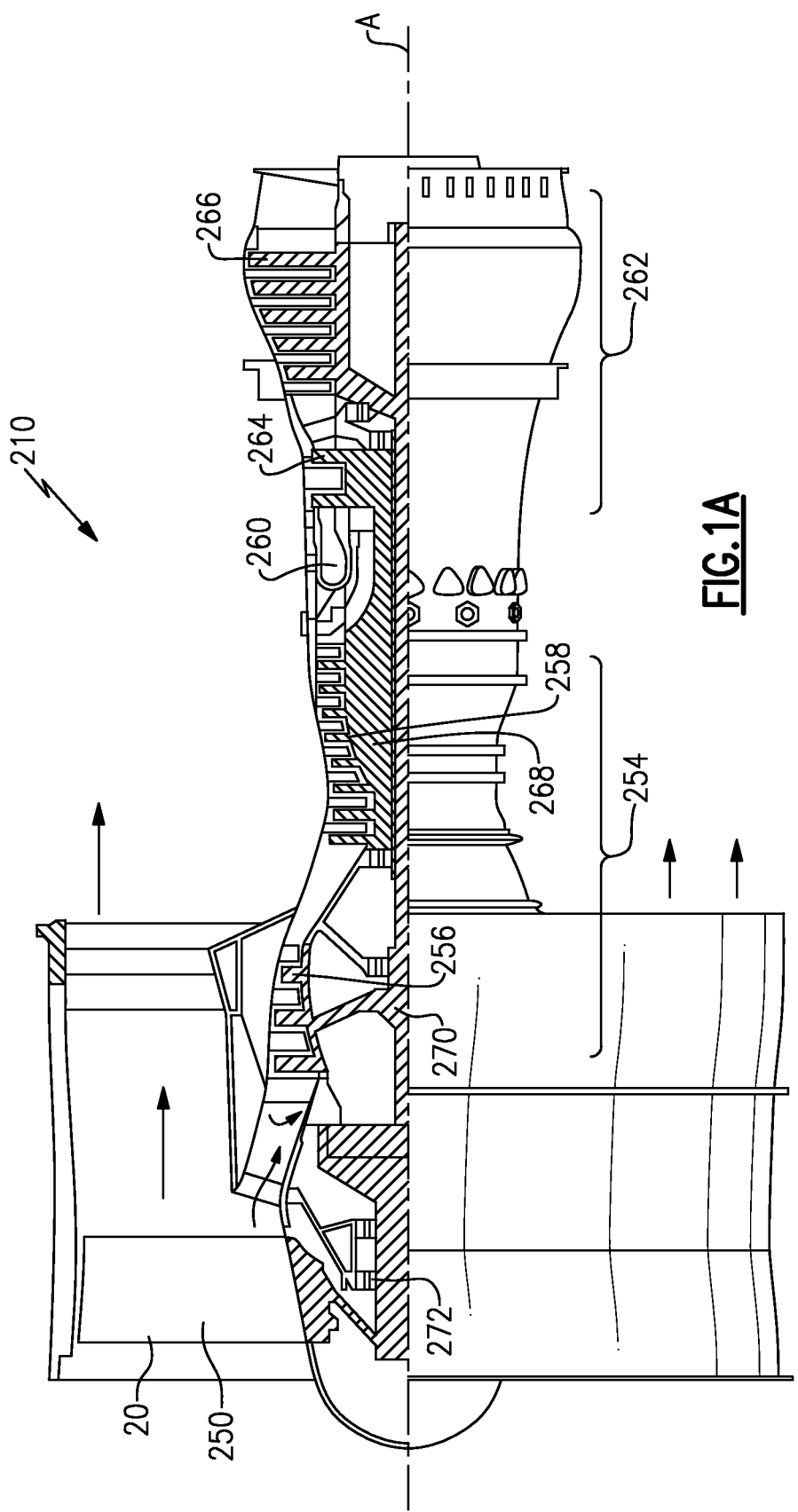
FIG. 1A schematically shows a gas turbine engine.

A gas turbine engine 210 is shown in FIG. 1A. As shown, the engine 210 includes a fan 250 (which includes a plurality of fan blades 20), a compressor section 254 (which includes both a low pressure compressor 256 and a high pressure compressor 258), a combustor 260, and a turbine section 262 (which includes both a high pressure turbine 264 and a low pressure turbine 266). The high pressure compressor 258 is driven, via a first spool 268, by the high pressure turbine 264. The low pressure compressor 256 is driven, via a second spool 270, by the low pressure turbine 266. Also driven by the low pressure turbine 266 are the fan blades 20 of the fan 250, which fan is coupled to the second spool 270 via a gear 272.

The fan 250 delivers air into compressor section 254. Air compressed by the compressor section is delivered into combustor 260. Products of the combustion in the combustor pass downstream over turbine section 262.

Figure 1B:
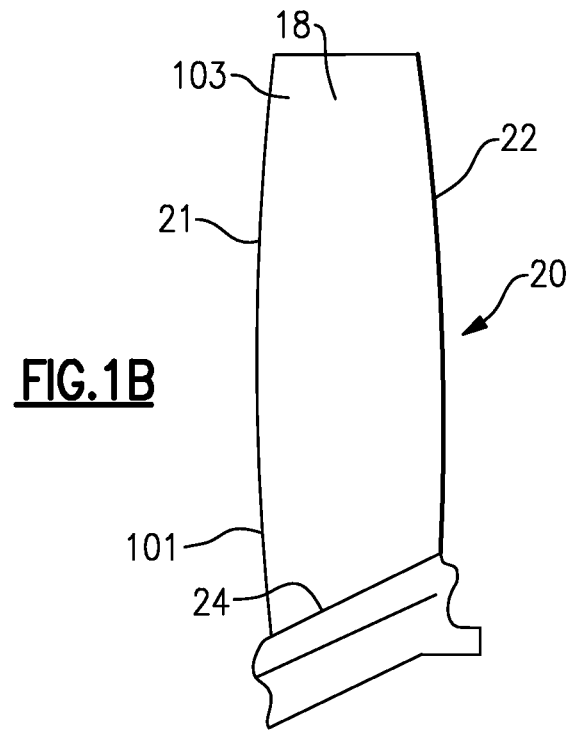
FIG. 1B shows a fan blade.

A fan blade 20 is illustrated in FIG. 1B having an airfoil 18 extending radially outwardly from a dovetail 24. A leading edge 21 and a trailing edge 22 define the forward and rear limits of the airfoil 18.

Figure 2:
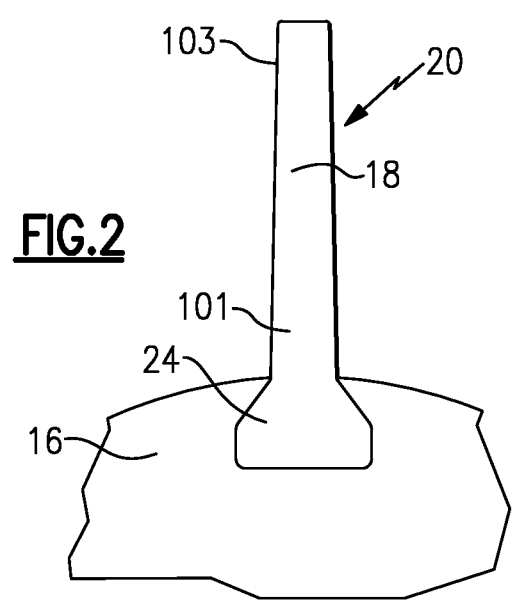
FIG. 2 is a second view of the fan blade.

As shown in FIG. 2, a fan rotor 16 receives the dovetail 24 to mount the fan blade with the airfoil 18 extending radially outwardly. As the rotor is driven to rotate, it carries the fan blade with it. There are higher stresses in fan blade 20 adjacent to the rotor 16 (area 101 for example) than occur radially outwardly (area 103 for example). On the other hand, area 103 is potentially more exposed to impact from foreign objects.

The present application deposits the material to form the fan blade in layers. The layers provide more freedom in achieving a final airfoil design compared to prior methods. By utilizing any number of deposition techniques, the designer can control specific features of each of the layers forming the airfoil, and can even control characteristics within the airfoil.

Returning for a moment to FIG. 1B, it may be desirable to have the fan blade be structurally stronger or thicker at areas 103 at the radially outer end of the airfoil 18, compared to radially inner areas 101, for example. Thus, it may be desirable to have a greater percentage of hollow at the radially inner area 101 than is found at the radially outer area 103. The prior art techniques for forming fan blades have not always provided sufficient freedom in specifically designing the characteristics and operational features of the fan blade along its radial length, and between the leading edge 21 and trailing edge 22. The prior art techniques for forming fan blades have not allowed for making the blades using customized functionally gradient material, which can be referred to structurally gradient (e.g. density) or material composition gradients such as Ti 6AL4V to Ti-6Al-2Sn-4Zr-2Mo or Ti-6Al-2Sn-4Zzr-6Mo.

Figure 3A:
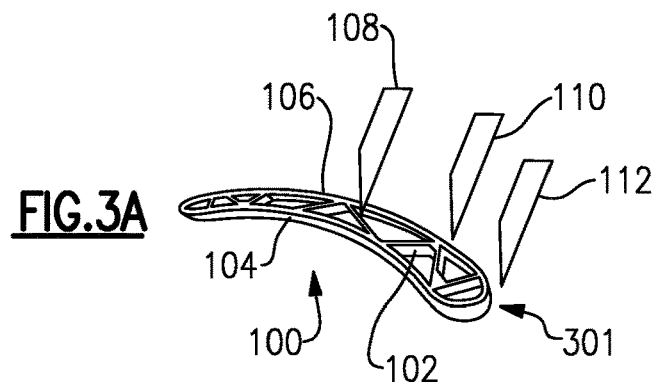
FIG. 3A shows a first step in a method.

FIG. 3A shows a technique for forming a fan blade 100 having a plurality of crossing ribs 102 crossing between the sides 104 and 106. Several well known additive manufacturing processes can be used. Powder feeder methods will be mainly used to fabricate the fan blades using additive manufacturing technologies. Multiple lasers, electron beam, or cold spray heads with direct powder feeders' machines can be used. In case of laser additive machine different types of lasers can be used—Yag or fiber in addition to CO2. The multiple lasers or electron beam with direct powder feed can be used to achieve better surface finish by varying each head deposition rate. This can reduce the required post-machining processes. Powder feeders 108, 110 and 112 are shown depositing material into a first layer 301 in FIG. 3A. In addition, other additive techniques for fabrication of the HFB are possible such as laser sintering of composite material e.g. PEEK or PEKK; laser or EBM powder bed.

Any number of techniques can be utilized to deposit material in layers. As one example, direct laser deposition may be utilized wherein powder is delivered in a molten pool created by laser and can be controlled to be deposited at specific locations to form the shape such as crossing ribs 102, and sides 104 and 106. Sides 104 and 106 will form suction and pressure sides in the complete airfoil. In addition, the density and profile can be closely controlled along with properties of each of the layers such as powder size, pool size, cooling rate, etc. This can all be controlled to achieve a desired microstructure, internal gradients, and internal cavity surface requirements.

Figure 3B:
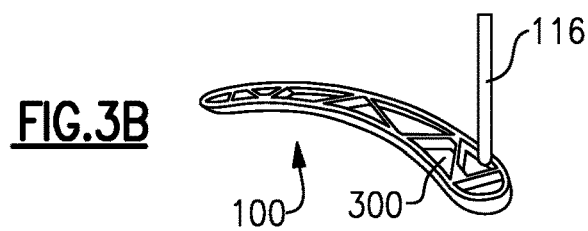
FIG. 3B shows a subsequent step.

As shown in FIG. 3B, a finishing tool 116 can then finish the internal surface of the layer 301 prior to the entire airfoil being complete. As an example, super-finishing such as REM finishing can be utilized to finish the internal surface of the intermediate layer 301 after it has been formed, to prevent crack initiation or propagation during the depositing of additional layers. Other surface finishing techniques can be also used including 5-axis machining of internal contour profile. Finishing the blades with an internal lattice structure that are made by additive manufacturing will be depending on the specific application design requirements, hence the surface finish of the lattice may be acceptable or may require a better finish. If cold spray process was used as additive manufacturing of the blade, post-thermal processing (e.g. variations in heat treatment) will be used to obtain the required grain size and mechanical properties. Controlled processing atmosphere will be used for optimum post-thermal mechanical processing. Heated, powder deposition chamber results in the equiax structure and minimal post-processing will be needed A minimum amount of material may be removed from the internal surfaces to achieve a desired lattice size. External surfaces could be finished using a multiple axis milling machine to obtain required surface finish. Deep rolling peening processes can then be used to induce compressive residual stress and enhance the hollow fan blade surface resistance to shock loads and to torqueing environment.

Figure 3C:
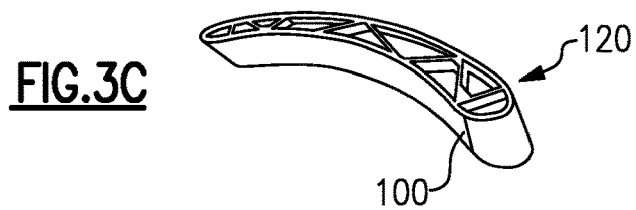
FIG. 3C shows a subsequent step.

As shown in FIG. 3C, subsequent layers 120 have now been deposited, and an airfoil is beginning to develop.

Figure 3D:
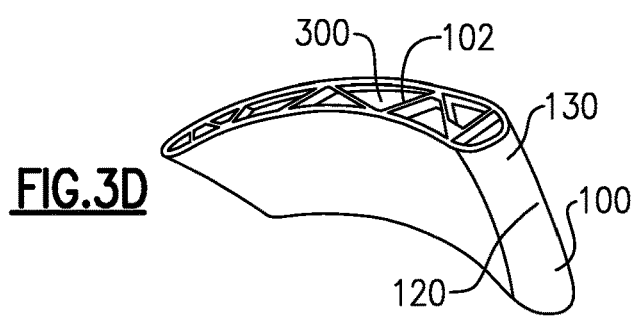
FIG. 3D shows yet another subsequent step.

FIG. 3D shows the addition of even more layers, such as layers 130. It should be understood that there could be any number of layers (hundreds for example) in the complete airfoil. Only three distinct layers are illustrated, however, the radial width of the layers can be controlled as desired to achieve desired density and material characteristics along the entire radial length of the airfoil.

Figure 3E:
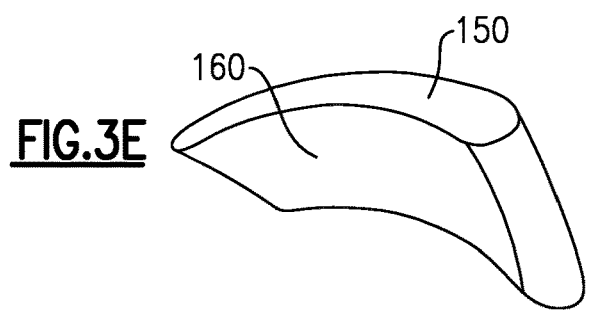
FIG. 3E shows another subsequent step.

FIG. 3E shows a subsequent step where a top end 150 closes off the internal cavities 300 such as formed by webs 102 shown in FIG. 3D. Now, a complete airfoil 160 is formed. It should be understood that the root 24 as shown in FIG. 1B can also be formed by this process, or any other process.

While the direct laser deposition is disclosed as one method of depositing the material in layers, other methods such as powder bed deposition, electron-beam deposition, direct metal deposition, or any number of other deposition manufacturing processes may be utilized.

Figure 4:
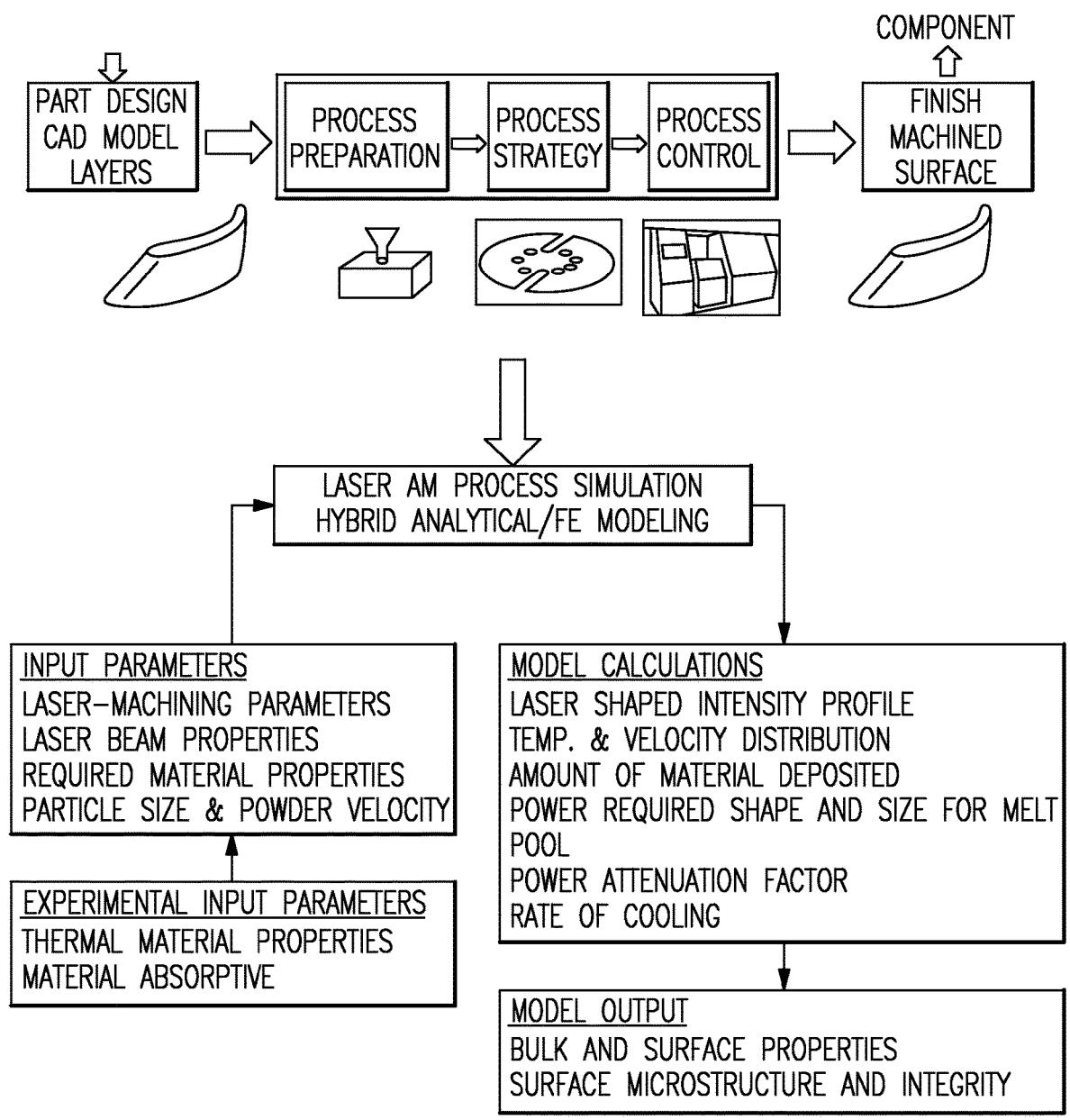
FIG. 4 is a process flow chart.

As shown in FIG. 4, a design process for utilizing the method as described in FIGS. 3A-3E, would start with input of experimental parameters such as desired thermal material properties and material absorptive properties.

In the proposed modeling process, a laser additive manufacturing process is used, however, the same modeling frame can be used to define and optimize the process parameters, The mathematical approach will depend on the process physics. In the presented example, laser machine parameters, laser beam properties, required material properties, such as particle size and powder velocity, would also be input into the method.

A laser process simulation and a hybrid analytical modeling may then be utilized.

The designer may then design laser intensity profiles, temperature and velocity distribution, the amount of material to be deposited at each layer, the required shape and size of the powder to achieve a desired melt pool to result in the desired shape would also be developed, A power attenuation factor and the rate of cooling would also be factors to be considered at this point along with any number of other factors which may be appropriate.

A model output may then be sent to a control for the deposition process.

Figure 5:
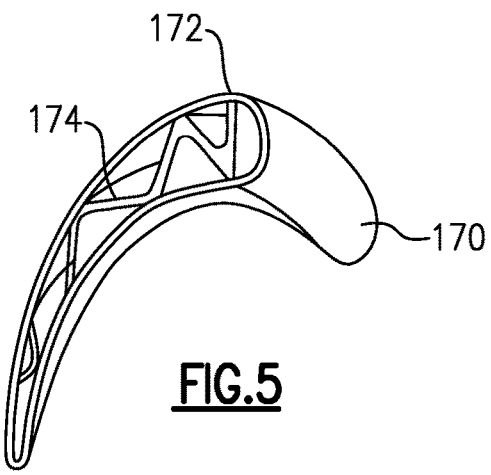
FIG. 5 is an example airfoil.

FIG. 5 shows features such as areas 170 which may desirably have 100% density, area 172 which may desirably have a density of 75%, and a web at area 174 which may have a 50% density. The prior art methods had difficulty achieving controlled density at each of the distinct layers in an airfoil, and the deposition of the material in layers as achieved by this application provides that ability.

Figure 6A:
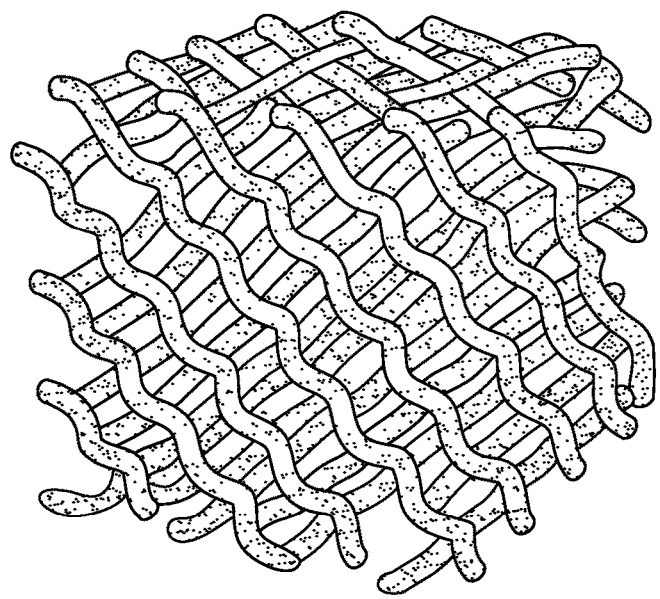
FIG. 6A shows a first density of material.
Figure 6B:
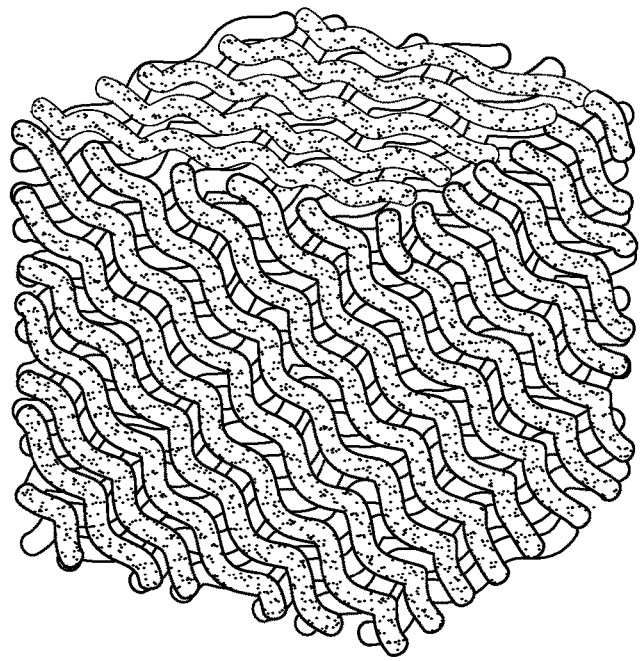
FIG. 6B shows a second density of material.

FIG. 6A shows an example of 20% density material, while FIG. 6B shows 40% density material. Again, a worker in the art of layer deposition would know how to achieve a desired density. It is the application of such techniques through the formation of airfoil structures which is unique in this application.

Although embodiments of this invention have been disclosed, a worker of ordinary skill in this art would recognize that certain modifications would come within the scope of this invention. For that reason, the following claims should be studied to determine the true scope and content of this invention.

The invention claimed is:

1. A method of forming an airfoil comprising the steps of:
depositing material to form the airfoil in a first layer, and then depositing material in a second layer on said first layer;
wherein said first and second layers have distinct densities; and
wherein the airfoil also comprises a first area, a second area, and a third area each having a distinct density, the distinct density of the first area being greater than the distinct densities of the second and third areas, said distinct density of the second area being greater than the distinct density of the third area, wherein said third area comprises webs formed between sidewalls defining said first and second areas.

2. The method as set forth in claim 1, wherein said first and second layers will be spaced radially when the airfoil is utilized as a rotating element.

3. The method as set forth in claim 1, wherein direct laser deposition is utilized to deposit the first and second layers.

4. The method as set forth in claim 1, wherein machining of internal cavities within the first layer occurs before the deposition of the second layer.

5. The method as set forth in claim 1, wherein a top layer is deposited which closes off internal cavities within said airfoil to define a radially outer end of the airfoil.

6. The method as set forth in claim 5, wherein internal machining is provided on the internal cavities within the airfoil prior to the deposition of the top layer.

7. The method as set forth in claim 5, wherein deep rolling peening processes are provided on the airfoil to induce compressive residual stress.

8. The method as set forth in claim 5, wherein external surfaces of the airfoil defining suction and pressure sizes are subject to surface finishing techniques after the deposition of the top layer.

9. The method as set forth in claim 1, wherein the airfoil is part of a fan blade for a gas turbine engine.

10. The method as set forth in claim 1, wherein said first layer is radially inward of said second layer, and said first layer having a greater density than said second layer.

11. The method as set forth in claim 1, wherein said first layer and said second layer include sidewalls, with webs crossing between said sidewalls.

12. The method as set forth in claim 1, wherein said distinct densities of said first and second layer is achieved by variation of each of laser intensity profiles, temperature and velocity distribution, an amount of material to be deposited at each said layer, a required size and shape of a powder, a power attenuation factor and a rate of cooling.

13. The method as set forth in claim 1, wherein said first area has a relative density of 100%, said second area has a relative density of 75%, and said third area has a relative density of 50%.

14. An airfoil comprising:
an airfoil body extending between a radially inner end and a radially outer end, said airfoil being constructed by deposition of a plurality of layers, and
said layers are deposited in changing densities, such that the density of said airfoil varies from said radially inner end to said radially outer end, said plurality of layers forming a first area, second area, and third area, said first area having a distinct density greater than distinct densities of said second area and third areas, said distinct density of the second area being greater than the distinct density of the third area, wherein said third area comprises webs formed between sidewalls of said first and second areas.

15. The airfoil as set forth in claim 14, wherein said layers will be spaced radially when the airfoil is utilized as a rotating element.

16. The airfoil as set forth in claim 14, wherein a top layer closes off internal cavities within said airfoil to define a radially outer end of the airfoil.

17. The airfoil as set forth in claim 14, wherein the airfoil is part of a fan blade for a gas turbine engine.

18. The airfoil as set forth in claim 14, wherein said distinct densities of said first and second layer is achieved by variation of each of laser intensity profiles, temperature and velocity distribution, an amount of material to be deposited at each said layer, a required size and shape of a powder, a power attenuation factor and a rate of cooling.

19. The airfoil as set forth in claim 14, wherein said first area has a relative density of 100%, said second area has a relative density of 75%, and said third area has a relative density of 50%.

* * * * *